United States Patent
Chan et al.

(10) Patent No.: US 8,878,998 B2
(45) Date of Patent: *Nov. 4, 2014

(54) VIDEO DECODER BLOCK

(71) Applicant: Broadcom Corporation, Irvine, CA (US)

(72) Inventors: Anthony Chan, Richmond Hill (CA); Chun Wang, Markham (CA); Edward G. Callway, Toronto (CA)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/849,928

(22) Filed: Mar. 25, 2013

(65) Prior Publication Data

US 2013/0222697 A1 Aug. 29, 2013

Related U.S. Application Data

(63) Continuation of application No. 11/847,879, filed on Aug. 30, 2007, now Pat. No. 8,405,779.

(60) Provisional application No. 60/824,239, filed on Aug. 31, 2006.

(51) Int. Cl.
 *H03M 1/12* (2006.01)
 *H04N 5/14* (2006.01)

(52) U.S. Cl.
 CPC .............. *H03M 1/1265* (2013.01); *H04N 5/14* (2013.01)
 USPC ........................................................ 348/572

(58) Field of Classification Search
 USPC ........................................................ 725/151
 See application file for complete search history.

(56) References Cited

U.S. PATENT DOCUMENTS

| | | | | | |
|---|---|---|---|---|---|
| 5,229,855 | A | * | 7/1993 | Siann | 348/588 |
| 5,940,572 | A | * | 8/1999 | Balaban et al. | 386/358 |
| 6,005,506 | A | * | 12/1999 | Bazarjani et al. | 341/143 |
| 6,184,935 | B1 | * | 2/2001 | Iaquinto et al. | 348/441 |
| 7,009,660 | B2 | | 3/2006 | Kim | |
| 7,339,628 | B2 | | 3/2008 | Gudmondson et al. | |
| 7,425,994 | B2 | * | 9/2008 | Haider et al. | 348/572 |
| 7,525,600 | B2 | | 4/2009 | Kaylani et al. | |
| 2002/0008780 | A1 | | 1/2002 | Han | |

\* cited by examiner

*Primary Examiner* — Nathan Flynn
*Assistant Examiner* — Alfonso Castro
(74) *Attorney, Agent, or Firm* — Foley & Lardner LLP

(57) ABSTRACT

A video decoder block provides a common pathway for processing video signals encoded using different video formats. The video decoder block passes the video signals through the same processing components in order convert the signals to a common format for display or storage. Each processing component cat be disabled or by-passed to enable or disable the function performed by the component. This reduces the number of components and signal processors required in devices that need to accommodate signals of different formats.

20 Claims, 3 Drawing Sheets

VIDEO DECODER BLOCK

CROSS REFERENCE TO RELATED APPLICATIONS

This application is a continuation of U.S. patent application Ser. No. 11/847,879, entitled "Video Decoder Block" and filed Aug. 30, 2007, and claims any and all benefits as provided by law of U.S. Provisional Application No. 60/824,239, filed Aug. 31, 2006, each of which is hereby incorporated by reference in its entirety.

STATEMENT REGARDING FEDERALLY SPONSORED RESEARCH

Not Applicable

REFERENCE TO MICROFICHE APPENDIX

Not Applicable

BACKGROUND OF THE INVENTION

The present invention is directed to methods and systems process or convert videos signals between standardized forms. Specifically, the invention is directed to methods and systems which use a common hardware system or method to process various different video signal formats.

Video source devices, such as set top boxes, TVs, and DVD players, often provide video in one or more of several standardized video formats, such as VGA, RGB and YPbPr. These video signals are typically input into video display devices and video recording devices which need to process the signals to decode or convert the signals to a form that facilitates display or recording. Typically, these video display devices and recording devices include separate subsystems for processing each of the different video formats and converting or decoding the input signal into the internal format that is used by the device.

In many cases, these video display and video recording devices include multiple inputs, allowing consumers to route multiple video sources through a single device for ease of viewing. This practice is also common with digital video devices such as digital TVs. It is desirable for these video devices to be compatible with pre-existing analog video sources, such as VGA sources and YPbPr sources because devices employing these formats are commonplace.

Analog formats such as VGA, RGB and YPbPr should be handled differently by digital video device. Generally, a digital video device will convert analog input formats to a common digital video format, such as YCbCr. The methods used for conversion of analog video signals to a digital video format vary with the input format. For instance, VGA/RGB format allows the device creating the signal to choose a frequency within a range, whereas YPbPr format uses a fixed frequency for the video signal. A digital video device receiving VGA and YPbPr inputs should sample these signals at different frequencies and use different methods and components when digitizing the analog signals. VGA sampling is performed by VGA specific circuitry capable of sampling at a variable frequency obtained from the VGA signal, whereas YPbPr sampling is performed by YPbPr specific circuitry that uses a fixed sampling frequency, which can be customized for that sampling frequency.

SUMMARY

In accordance with the invention a common subsystem and method can be used to process and convert different forms of analog video signals into digital video signals for displaying or storing the video. The each of the analog video signals are converted digital signals by a set of analog to digital converters which sample the signals at either a fixed frequency or a variable frequency, depending on the mode of operation. In some modes of operation, the analog video signals can be over-sampled and then processed by one or more decimators to reduce the number of samples to produce the desired digital video signal having the desired pixel data rate. In other modes of operation, the analog video signals can be over-sampled and then processed in a mode where the decimators are either turned off or bypassed so that output digital pixel rate is the same as the sample rate. In this way, the same subsystem can be used to process different types of analog video signals in a system that uses less circuitry and less power.

DETAILED DESCRIPTION OF THE INVENTION

The present invention is directed to a method and system for processing analog video signals which uses the same signal processing hardware system to process, decode or convert signals of different formats into a digital format for display or storage.

Embodiment of the invention provides an analog to digital conversion system for analog video based on RGB/VGA and YPbPr Component video standards. VGA/RGB signals are sampled at a frequency based on the sync signals of the VGA or RGB inputs, and Component video signals are over-sampled at a fixed rate, to digitize analog signals. The resulting digital video signals are handled by the same signal processing blocks, which may be selectively enabled or disabled based on the detected analog format, such that component video signals are decimated and filtered, while VGA signals are left in tact and optionally converted to a YUV, YCbCr or other color space format prior to storage or display. Other embodiments are within the scope of the invention.

Embodiments of the invention can provide one or more of the following capabilities. Size and complexity of a video converter can be reduced. Greater precision during processing of digital video signals than using 8-bit devices can be provided.

Figure 1:
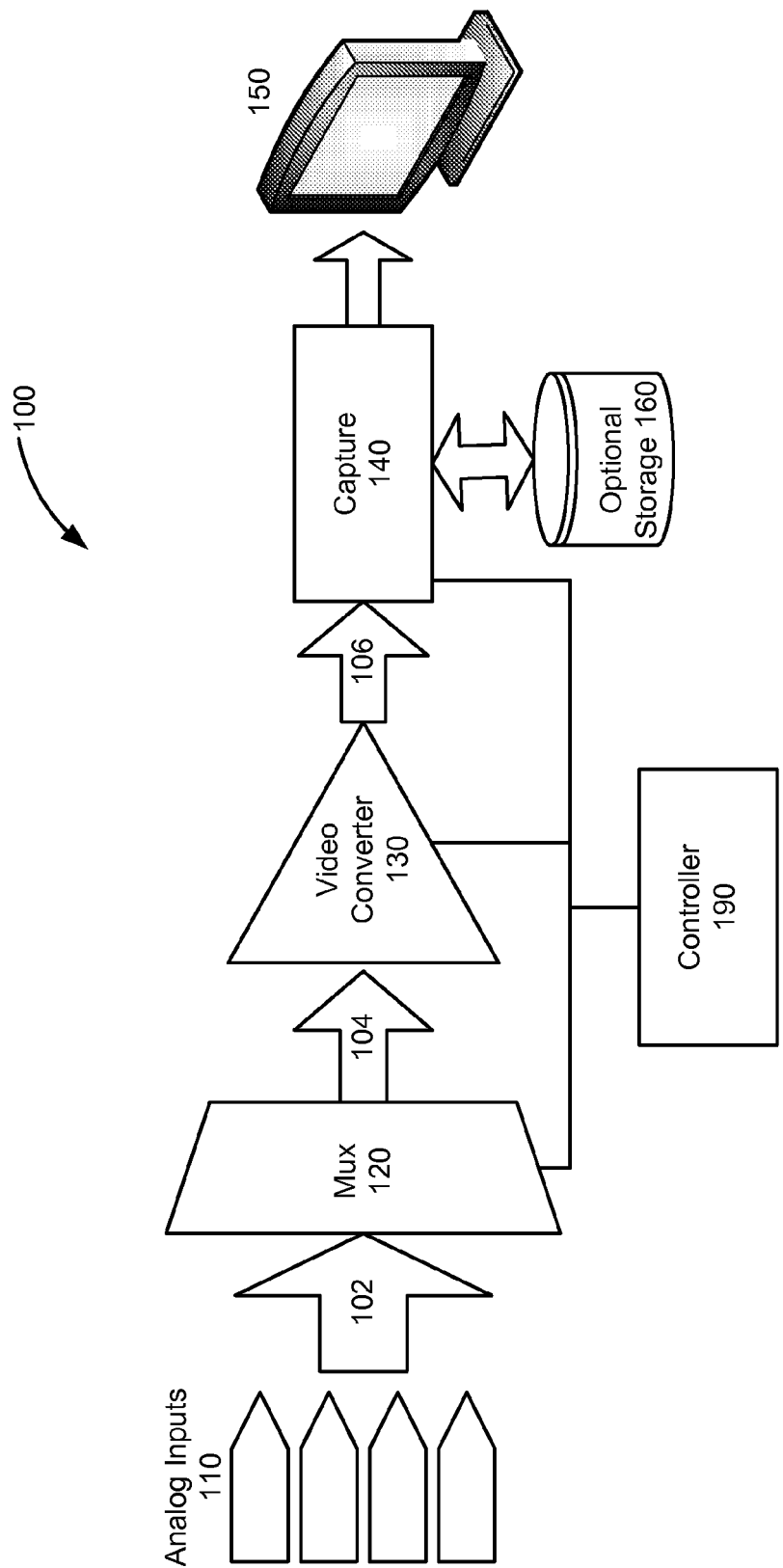
FIG. 1 is a system level diagram for a video receiver to use in accordance with the invention.

FIG. 1 shows a block diagram of a general purpose video decoder system 100 that can be used in accordance with the invention for receiving analog video signals and for converting the video signals to a digital format, optionally processing the digital signals, and displaying or storing the video content. The system 100 can be integrated into a video card, set top box, portable video device, digital TV, or other device that can accept analog video inputs and output a digital video signal for display. The system 100 may be implemented as a single hardware element, such as an ASIC or FPGA, as part of a larger hardware element, or as a combination of hardware elements. The system 100 can store the digital video signals for later display or stream the digital video signals for immediate display.

The system 100 can include inputs 110 that are analog video inputs for receiving analog video signals. The inputs 110 can be capable of receiving analog signals of another device and can be coupled to another system block as part of a larger system. The input analog video signals can be received from sources, such as an analog output of another device connected to an external interface/input 110 of the system 100 or a controller integrated with the system 100 for deriving analog video signals from a wireless signal, an analog tape, etc. The inputs 110 can receive a variety of input formats for example including separate R, G, B channels or channels carrying other color space information. These signals can be mixed into a single composite channel or can remain in a component format. The inputs 110 can include separate control channels for tinting information such as vertical and horizontal synchronization information. Each of the inputs 110 can be dedicated to a predetermined video format, such as RGB/VGA or YPbPr. In such embodiments, the inputs 110 can include a variety of input signal formats and connector formats.

Alternatively, the system 100 can include at least one input 110 capable of handling multiple video formats. This input 110 can detect the analog video format by observing signal characteristics such as timing, voltage, frequency, etc., or can be configured to receive a given input format during the operation of the system 100 by an external control, such as a micro controller or CPU 190.

The signals received via the inputs 110 can be multiplexed by multiplexer 120. Multiplexer 120 can be controlled by a microcontroller or CPU 190, which can be integral to the system 100, or can be a separate component. Multiplexer 120 can pass the analog video signals 104 of a single video input from inputs 110 to video converter 130. Video converter 130 can be implemented as single component or group of components within a small area. Multiplexer 120 can pass the analog video signals 104 of a single video input from inputs 110 to alloy multi-channel capture for picture-in-picture or multi-channel digital video use. The analog video signals 104 comprise multiple video signals associated with a single video input. For instance, analog video signals 104 can contain separate signals for R, G, and B associated with a VGA or RGB input selected by mux 120 from analog video signals 102 that are associated with one of the various inputs 110.

Video converter 130 can convert the analog video signals it receives to a digital format, such as YUV, YCbCr or digitized RGB. Video converter 130 can include one or more subsystems including, for example, analog to digital converters and filters. The same subsystems can be used for converting more than one analog signal format to a common digital signal format. Instead of dedicating multiple data paths for each possible format, all signal formats follow the same data path. The video converter 130 can contain data paths suitable for converting a single video stream or replicated data paths for multiple video streams to be concurrently converted.

Figure 2:
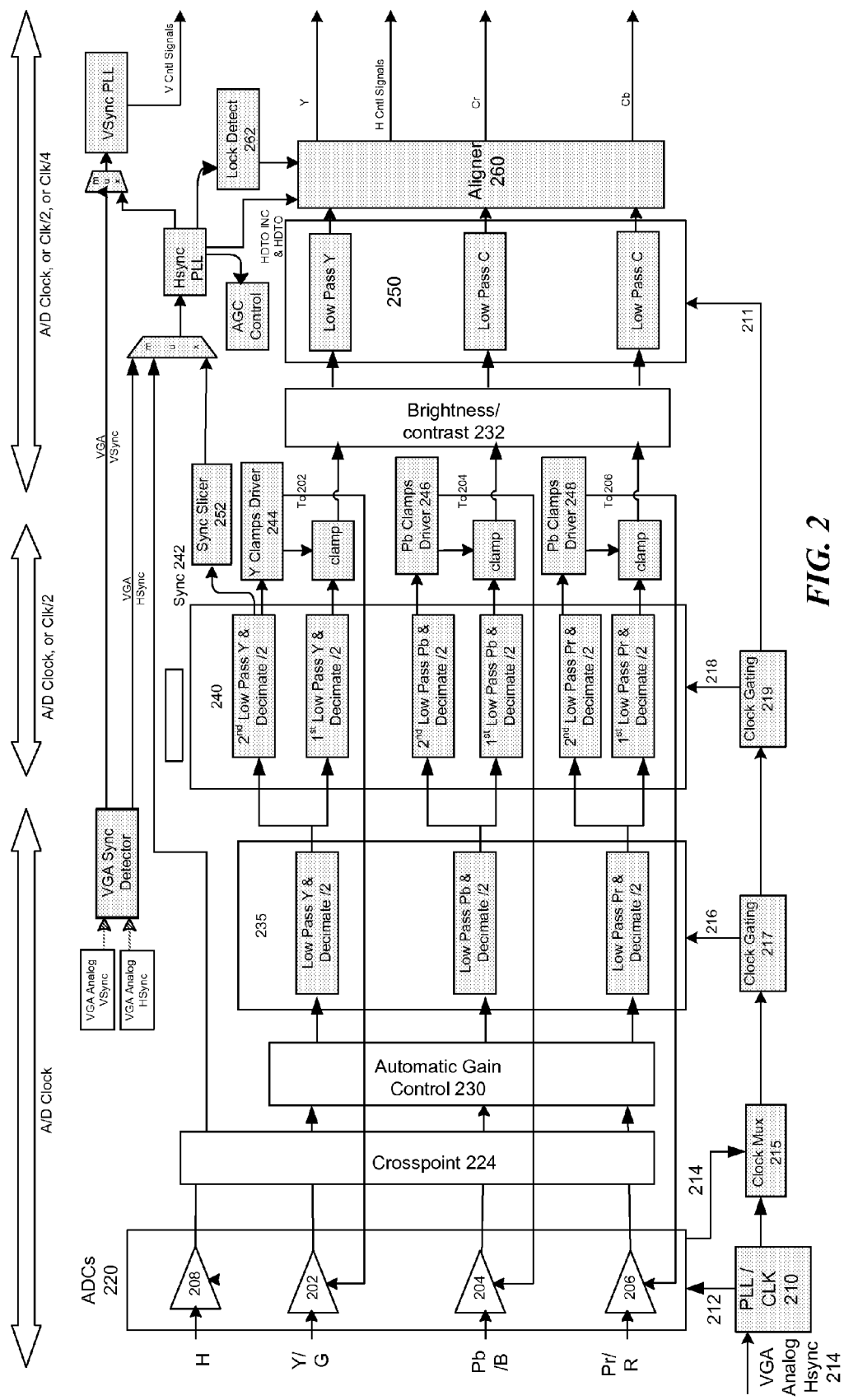
FIG. 2 is a schematic of a video converter for use with the invention.

For illustrative purposes an embodiment of video converter 130 suitable for capturing a single video stream is shown in FIG. 2. The output 106 of video converter 130 can be, for example, in YCbCr format regardless of the analog video format of the analog video signals received at inputs 110. Alternatively, the output 106 of video converter 130 can be in a digital RGB format. In addition, the video converter 130 can operate on a subset of available video formats, such as VGA and component video, while other analog video formats are handled by a separate hardware system, such as an NTSC tuner.

Capture block 140 receives digitized video streams 106 from video converter 130. Capture block 140 is responsible for storing the digitized video streams 106 in a buffer for later or current use. For instance, capture block 140 can interface a hard drive 160 (or other data storage device) to store many hours of video for later display in a digital video recorder. Capture block 140 can also interface to RAM (which can be on board a chip containing system 100, on the same circuit board, or can be part of main system memory, e.g., if system 100 is used as part of a larger PC system), e.g., for storing a few frames at a time. Capture block 140 can also contain hardware for, or implement instructions for, manipulating the digitized video signals it receives, such as performing comb filtering or other filtering or other digital signal processing.

Capture block 140 can be a dedicated hardware device, as shown in FIG. 1, or can be absent from the system 100. If a dedicated capture block 140 is not used, digitized video streams 106 cat be sent to a memory accessible to a CPU 190, which can implement instructions, causing the CPU to act like the capture block 140. Capture block can also be used with a memory device 160 to store video signals for time shifting applications.

Digitized and buffered or stored video signals can be selectively displayed by a display device 150, such as an LCD, plasma screen, computer monitor, etc. This display device can show the video signals in close temporal proximity to receipt of the analog signals at inputs 110, or later, e.g., with system 100 used as part of a DVR. If the display 150 is an analog display, video signals 106 can be converted back to a suitable analog form a using known techniques.

The video converter 130 in FIG. 2 can digitize analog video signals having multiple formats. Video converter 130 converts analog signals containing VGA and YPbPr formats to a common YCbCr format. ADCs 202, 204, and 206 sample component input signals for a video stream. The signals sampled by ADCs 202, 204, 206 correspond to G, R, B respectively when video converter 130 converts RGB format signals and correspond to Y, Pb, Pr respectively when video converter 130 converts YPbPr format signals. Optional ADC 208 can be used for digitizing external sync information, such as a TTL HSync from a VGA signal. Sampled sync information can be used to adjust the sampling clock using a line-locking technique. ADCs 202, 204, 206, 208 are collectively referred to as ADCs 220. ADCs 220 can have 8 bit or greater resolution because digital video formats typically use 8-bit fields or larger fields. For example, ADCs 220 can be 12-bit devices. The sampling frequency of the ADCs 220 can be selected from a multiple of the possible output pixel data rates for the desired output digital signal. In one embodiment, the sample rate can be 108 MHz and the output pixel data rate can be, for example 108 MHz, 54 MHz, 27 MHz and 13.5 MHz. Depending on the other available signal processing and down sampling stages, other sampling rates can be used achieve the desired output pixel frequency.

A cross-point multiplex switch or mux 224 can set the data path that each output of ADCs 220 will follow. Cross-point mux 224 can also set the path of feedback signals to ADCs 220. Cross-point mux 224 can be constructed statically, by fixing the data paths to the respective outputs of ADCs 220 at the time of manufacture, or can be configurable such as by control signals from a processor or controller. Cross-point mux 224 provides an electrical path between ADCs 220 and the gain, filtering, and decimation portions or components of the video converter 130.

With the inputs 110 AC coupled to the input signals, capacitance in the input pads that make up inputs 110 can slowly charge based on the incoming signal, causing a DC drift in the voltage measured at the inputs 110. To account for this, a slow feedback charge pump clamp can be used to provide a DC offset to the ADCs 220. This offset can be provided to ADCs 220 via an analog signal or digital control signals or voltage pulses to charge or discharge a capacitor coupled to the ADCs 220 for providing a reference voltage. Preferably, this voltage clamp can reduce the DC input drift below 3-5 Hz. Each color or luminosity channel can have a separate clamping circuit that can feed back to the ADCs 220. Clamp drivers 244, 246, and 248 can operate by detecting the back-porch level in the signals that have been sampled by ADCs 220 for comparison to an expected value. For instance, a back-porch level corresponding to a black level can be expected to correspond to a 300 mV value. Clamp drivers 244, 246, and 248 can also operate by monitoring a voltage level, such as the back porch voltage and determining if it drills over time, indicating a capacitive charge or discharge. In addition to feeding back to clamping capacitors in the ADCs 220, clamp drivers 244, 246, and 248 can control a feed-forward clamp that can be interspersed in the signal path after the decimation stages. While the feedback clamp can be used to remove the effects of a DC offset, the feed-forward can be used to remove time-varying effects or noise, such as 60 Hz hum.

Analog video signals 104 provided to ADCs 220 can contain video information at different frequencies depending on the format of the signal. ADCs 220, can sample the analog video signals 104 at different rates that can depend on the video format of the input signal. For instance, VGA video signals can vary in a wide range of frequencies, depending on screen resolution and refresh rate, whereas YPbPr frequencies are predetermined based on standard resolutions, such as 480i, 480p, 720p, 1080i, etc. VGA signals can include synchronization information that can be used to determine the correct sampling frequency for the analog video signals. The format of the underlying analog video signal 104 can be determined in several ways, for example, in hardware or in software. For instance, the signal type can be determined by the configuration of the system, such as assigning fixed inputs (and using predefined connector types) within inputs 110 to a given format. Sync information supplied by lock detect unit 262 can be analyzed by a system controller and compared to known or expected sync patterns of determine the format, refresh rate and/or resolution of the signal 104 being converted. Lock detect unit 262 or the sync slicer 252 also provide an indication of whether sync has been detected or not (which can be interpreted as an indication that a blue screen should be displayed by display device 150), and may determine the format, refresh rate and/or resolution of the signal 104 being converted, without using software to make the determination.

Video converter 130 can include a phase-locked loop, PLL 210, which can be used for synchronizing ADC conversion of the analog signals. PLL 210 can determine and generate the sampling clock 212 from horizontal synchronization information, HSync 214, associated with a received VGA signal, or a predetermined clock, in the event that ADCs 220 are sampling a YPbPr signal. When a VGA signal is detected, ADCs 220 sample the VGA video data at a rate determined by the VGA signal. The rates used by ADCs 220 generally are selected to be greater than the Nyquist limit of underlying video signal. For example, the rate can be 108 MHz.

PLL 210 is capable of setting a fixed frequency for clock 212 when a YPbPr video signal is detected, e.g., to accommodate different video formats (for example, for YPbPr, for 480i, 720p, 1.080i, etc.). PLL 210 can also adjust the fixed frequency of clock 212 by applying an error signal to the clock source, such as a voltage controlled oscillator. The error signal can be determined by the sync slicer 252. Sync slicer 252 can operate on a low-pass-filtered version of the Y signal that is useful for determining the HSync timing in the Y signal. By observing changes in the period of the Y HSync, errors due to sampling rate can be approximated. This approximate error can be used by PLL 210 to adjust the fixed sampling rate slightly to reduce error due to sampling rate and perform line locking.

PLL 210 can also adjust the frequency of clock 212 to follow the frequency of a VGA or YPbPr signal and to compensate for varying line lengths in the analog video signal. ADC 208 can convert the analog VGA HSync signal (or Y HSync signal) to a digitized HSync signal and use the HSync signal to adjust the frequency of the clock 212. Sync slicer 252 or a similar circuit can monitor the digitized HSync signal for jitter. An error signal can be fed back to PLL 210 to fine tune the line locking. PLL 210 can utilize the error signal to adjust the sampling clock it generates to increase the accuracy of sampling of VGA and YPbPr signals.

Sync slicer 252 preferably operates by selecting a threshold voltage value and comparing the digitized HSync signal (e.g. VGA HSync signal or low-pass filtered Y channel of YPbPr signal) to this value. Sync slicer 252 generates a timing signal that is created by observing when the HSync signal transitions below and above the threshold volt value, which indicates the leading and trailing edges of the HSync pulses. Sync slicer 252 or an HSync PLL can compare successive HSync pulses, and generate an error signal indicating line-to-line differences in the timing and discrepancies between the expected number of pixels and the measured number of pixels per line. Alternatively, a counter can associate a timestamp with the pixel locations of the samples that have been sampled between the sync pulse edges. The counter can be configured to reset when an expected value has been reached. This value is determined by the expected number of pixels in the video line. If the counter resets out of sync with the HSync pulses, a counter increment can be adjusted. This increment can be provided to the aligner 260. Aligner 260 can use the increment to determine how to align pixel values.

Real-world video devices do not output uniform voltages for video signals, but it is desirable to create a digital video signal having a set range of voltages. An automatic gain control stage 230 can adjust the dynamic range of put of ADCs 220. A coarse gain adjustment may be provided in the ADCs 220 for choosing a range for sampling the analog signals. For example, if the analog video signal is weak at inputs 110, a high gain condition can be used by ADCs 220, such that, for instance, a 0.75 vpp signal will cover the entire range of output values for the ADCs 220. If the video signal at inputs 110 is strong, a normal gain condition can be used by ADCs 220, such that, for instance, a 1.5 vpp signal will cover the entire range of output values for the ADCs 220. Various ranges of ADC gain settings can be determined and applied, e.g. as appropriate. Which ADC gain setting is appropriate can be determined, e.g., by choosing a setting in software, by observing the sync height, by observing the peak voltage values in the video signal during a time period, or by choosing a setting for signals of a given type, such as employing the normal gain setting for VGA signals.

Automatic gain control (AGC) stage 230 can provide a coarse adjustment to the output values of the ADCs 220 before these values are manipulated by the filtering and decimation blocks. Another AGC stage 232, such as for providing brightness and contrast control, can be used to provide a finer adjustment to video signal values after decimation and prior to the final low-pass filter and alignment stages. The AGC stages 230 and 232 preferably operate on the values of the video channels (Y/G, Pb/B, Pr/R) to maintain the values within a range of values to reduce noise, clipping, and to keep the output values within an expected range. The AGC stages 230 and 232 can operate by multiplying values of the video channels by respective values, which can usually be different for AGC stage 230 and AGC stage 232. Further, AGC stages 230 and or 232 can also apply offset values to the video signal data. The gain/multiplication and/or offset values used by automatic gain control stages 230 and 232 can be determined using known methods and can be based on external information or information about an observed signal, or a predetermined offset can be applied for video signals. For instance, the multiplication values used by automatic gain control stages 230 and 232 can be determined by observing the height of the sync pulses, such as HSync 242 or the digitized VGA hsync signal produced by ADC 208. The Hsync information can be used to determine gain values that are applied to the three video channels such that each channel experiences the same gain.

After applying a first AGC correction to the digital video data, the data is passed to a first low-pass filter and decimation (F/D) block 235. Each channel can be operated on by a low-pass filter and a decimator, both of which can be enabled or disabled. When F/D block 235 is enabled, clock gating 217 reduces the clock for the data by half. When the digital video data represents sampled RGB/VGA data, the low-pass filter and decimator in F/D block 235 are preferably disabled. When the digital video data represents sampled YPbPr data, the low-pass filter and decimator in F/D block 235 can be selectively enabled. The system can selectively enable and disable the filter and decimation blocks, such as F/D block 235 based on the resolution of the YPbPr signal. For instance, if the resolution of the YPbPr signal is 480i or 480p, the first low-pass F/D block 235 can be enabled, and preferably are not enabled if the resolution of the YPbPr signal is 1080i or 720p, 480i and 480p video signals inherently contain less data than 1080i and 720p video signals and operate at a lower frequency. By low-pass filtering the signal and decimating it by a factor of 2, the first F/D block 235 can effectively reduce the frequency of the data by a factor of 2. Low-pass filtering of the Y, Pb, and Pr signals can be used to reduce the noise prior to decimating samples.

After applying the selectively enabled first RD block 235 to the digital video data, the data is passed to a 2nd low-pass filter and decimation (F/D) block 240. Each channel can be operated on by a first low-pass filter and a first decimator in this F/D block 240, both of which can be enabled when the video signal is YPbPr. Each channel can also be operated on by a second low-pass filter and a second decimator in this F/D block 240, both of which can be enabled or disabled. When F/D block 240 is enabled, clock gating 219 reduces the clock for the data by half. When the digital video data represents sampled RGB/VGA data, the low-pass filters and decimators in F/D block 240 can be disabled. When the digital video data represents sampled YPbPr data, the low-pass filters and decimators in RD block 240 can be selectively enabled. The F/D blocks, such as F/D block 240 can be selectively enabled based on the resolution of the YPbPr signal. For instance, if the resolution of the YPbPr signal is 480i, the filters and decimators of F/D 240 can be enabled, and if the resolution of the YPbPr signal is 1080i, 720p, or 480p the filters and decimators of F/D 240 can be disabled. Alternatively, the second RD stage 240 can be used to filter and decimate 480p if the first F/D 230 stage is not enabled. The second low pass filter in F/D block 235 preferably applies a lower filter cutoff frequency than that applied by the first low pass filter, and can act in parallel to the first low pass filter in F/D block 240. The second filter in F/D block 240 can effectively remove or reduce video data from each channel, which can produce a cleaner signal for purposes of observing sync voltages, timing, back-porch voltages, etc, which can be used for AGC, clamping, or determining the format of the video signal. The second filter of F/D block 240 can provide a cleaner signal than the first filter of F/D block 240.

After the second filter and decimation block 240, the upper analog frequency (pass band) is preferably below the Nyquist frequency. A further low pass filter stage 250 can be applied to the video data to reduce possible high-frequency noise prior to an alignment stage 260. The output of video converter 130 can be data at a rate of: 13.5 MHz when the resolution of the video signal converted is 480i; 27 MHz when the resolution of the video signal converted is 480p; and 74.5 MHz when the resolution of the video signal converted is 1080i or 720p. Low pass filter stage 250 can be selectively enabled to filter the video signal at approximately 50% of these frequencies when a YPbPr video signal is being converted. In addition, low pass filter stage 250 can be selectively disabled when whet the video signal being processes is a RGB/VGA video signal, effectively bypassing the filter stage 250.

After filter stage 250, YCbCr/YPbPr data can be aligned using alignment block 260. Alignment block 260 can be used to correct over-sampled Y, Cb, and Cr data, which can include samples that fall between discrete pixel values. For instance, when pixels are missing due to a slow sampling clock, alignment block 260 can interpolate the correct number of pixels. Alignment block 260 can up-sample or down-sample or adjust for jitter of the YPbPr signal to create individual discrete pixel values at the expected frequencies and spacing for the detected video resolution. Alignment block 260 can be disabled or bypassed so that alignment is not performed on RGB data.

After alignment stage 260, YCbCr/YPbPr data can be further decimated, e.g., if the YUV format for later storage or display is 4:2:2 or 4:2:0. In addition, only Cb and Cr data can be decimated to convert the signal to either 4:2:2 or 4:2:0 formats.

RGB data can be converted to YCbCr data using any well-known arithmetic relationship. (For instance, Y'= 16+65.481*R'+128.553*G'+24.966*B'; Cb=128− 37.797*R'−74.203*G'+112.0*B'; Cr=128+112.0*R'− 93.786*G'−18.214*B'.) RGB data can be converted prior to alignment by alignment block 260, or prior to decimating the YCbCr data to 4:2:2 or 4:2:0. Alternatively, RGB data can be used without conversion by converter 130.

Figure 3:
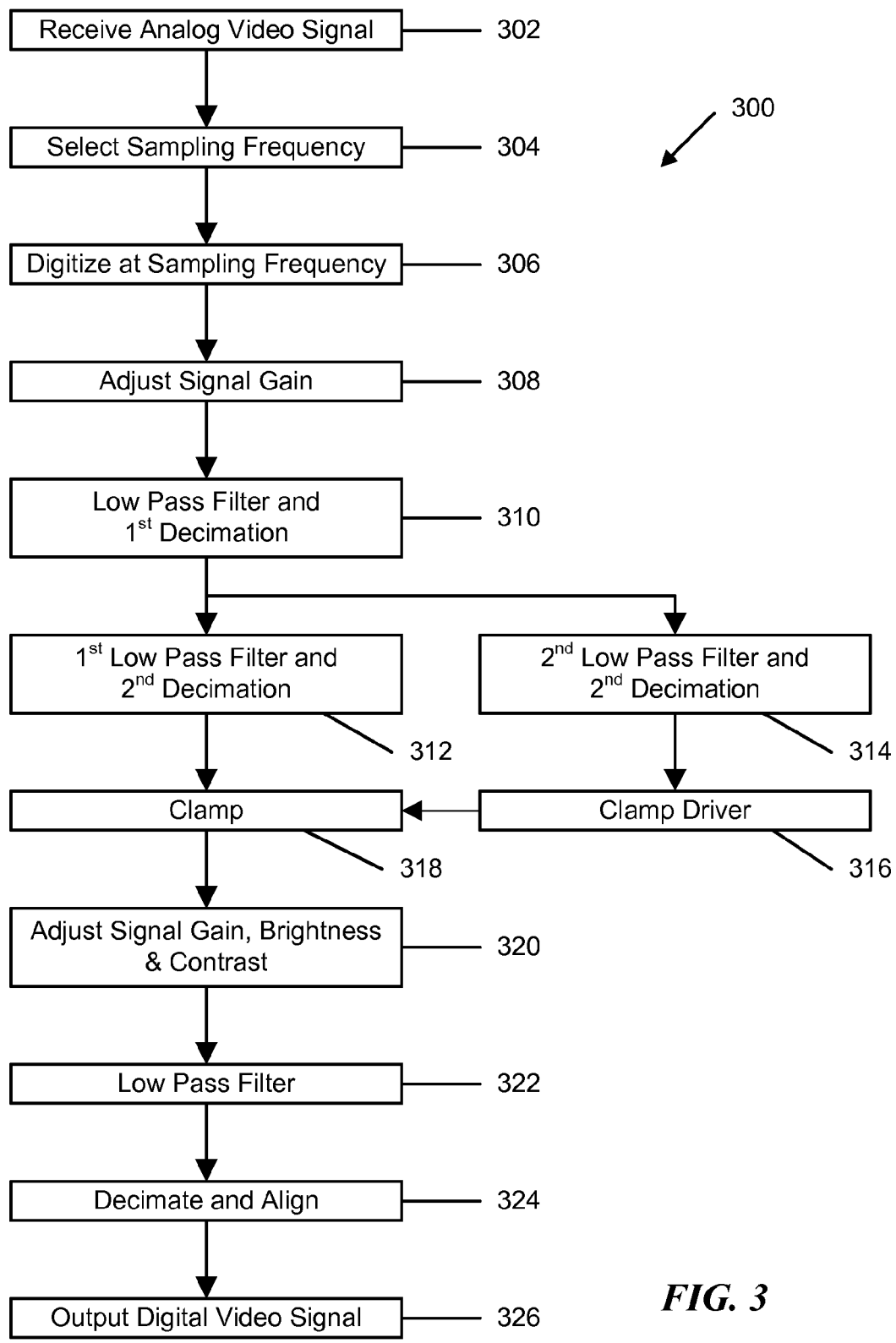
FIG. 3 is a flow chart of a method for converting analog video signals according to the invention.

FIG. 3 shows a flow chart 300 of a method of processing analog video signals according to the present invention. At step 302, component analog video signals are received at a video converter device according to the invention. If composite video is received, the signal can be converted to component video signals for input into the video converter. Alternatively, the video converter can include an industry standard converter to convert the composite video signal to component video signals.

At step 304, the converter determines the appropriate sampling frequency for the input signal. For VGA signals, the sampling frequency is controlled as a function of the VGA Horizontal Sync input signal and desired digital video output signal. A PLL can be used to lock the sampling frequency to VGA HSync signal. For YPbPr, the sampling frequency can be set to a fixed frequency that is selected as a function of the desired output video signal. As indicated above, by detecting the type of input signals, the sampling frequency can be either tied to a PLL or set to one of a set of fixed frequencies.

At step 306, the analog video signal is converted to a digital video signal sampled according to the sampling frequency determined in step 304. The digital video signals output from the ADCs can be input into a cross-point multiplexer switch which can enable the signals to be placed on different paths.

At step 308, the digital video signals can be processed by an automatic gain control component, to adjust the signal levels to optimum levels for further processing. The AGC stage can be used to adjust the dynamic range of the signal to reduce noise and clipping.

At step 310, the digital signals can be processed through a low pass filter to reduce noise and decimated to reduce the data rate. The decimation step can be used to reduce the pixel data rate, where sampled pixel data rate is greater than desired output data rate. When the digital signal is derived from RGB or VGA analog signals, the low pass filter and decimation step 310 can be disabled or by-passed.

At steps 312, the digital signals can be processed by a first low pass filter to reduce noise and decimated to reduce the data rate. The decimation step can be used to further reduce the pixel data rate, where sampled pixel data rate is greater than desired output data rate. By providing multiple stages of decimation, the process can accommodate many different input signal formats and sampling data rates and produce for output, many different digital video signal formats. When the digital signal is derived from RGB or VGA analog signals, the first low pass filter and decimation step 312 can be disabled or by-passed.

At steps 314, the digital signals can be processed by a second low pass filter to reduce noise and decimated to reduce the data rate. The second low pass filter can apply a lower filter cutoff frequency than that applied by the first low pass filter, and can act in parallel to the first low pass filter of step 312. The second low pass filter can effectively remove or reduce video data from each channel and can produce a cleaner signal for purposes of observing sync voltages, timing back-porch voltages, etc, and can be used for ADC, clamping, or determining the format of the video signal. The second low pass filter can provide a cleaner signal than the first low pass filter of step 312.

At step 316, the clamp drivers monitor the base voltage levels (back porch, black levels, etc.) of the digital video signals to determine if they drift over time. The clamp drivers can provide signals that are fed back to the clamping capacitors in the ADCs to control capacitive charge and discharge and remove the effects of a DC offset. In addition, the signals from the clamp driver can be sent to a feed forward clamp and at step 318 a claim can be applied to removed time varying effects and noise.

At step 320, the digital video signal can be processed by a finer grain ADC stage to control brightness and contrast of the digital signal and to provide finer adjustment of the dynamic range of the signal.

At step 322, the digital video signal can be processed through a low pass filter to further reduce high-frequency noise prior to the alignment stage 324. When the digital signal is derived from RGB or VGA analog signals, the first low pass filter step 322 can be disabled or by-passed.

At step 324, the digital video signal can be processed through another decimation stage to provide further down-sampling in order to further reduce the pixel data rate. The digital video signal can also be processed through an alignment process no that the pixel values can aligned according to the output frequency. The alignment process can be disabled or by-passed for RGB based video signals. YPbPr and YCbCr signals can be further decimated where YUV format for output is, for example 4:2:2 or 4:2:0, to reduce the 4:4:4 digital video signals by decimating only the Cb and Cr data to convert them to a different format.

At step 326, the digital video signal can be output to a display system, memory, a video storage system, a capture device, etc.

Other embodiments are within the scope and spirit of the invention. For example, due to the nature of software, functions described above can be implemented using software, hardware, firmware, hardwiring, or combinations of any of these. Features implementing functions may also be physically located at various positions, including being distributed such that portions of functions are implemented at different physical locations.

Further, while the description above refers to the invention, the description may include more than one invention.

What is claimed is:

1. A method for converting analog video signals to digital video signals, the method comprising:
   receiving an analog video signal;
   determining a characteristic of the analog video signal;
   converting, with an analog to digital converter and based on the characteristic of the analog video signal, the analog video signal to a digital video signal having a video resolution;
   selectively disabling at least one of a low pass filter or a decimator of a video converter as a function of the video resolution of the digital video signal, the video converter comprising the analog to digital converter, at least one automatic gain control component, the low pass filter, and the decimator; and
   processing the digital video signal using the video converter to produce a digital video output signal.

2. The method of claim 1, wherein the video converter further comprises an aligner, and processing the digital video signal further comprises aligning the digital video signal according to a predefined output frequency as a function of the characteristic of the analog video signal.

3. The method of claim 2, wherein aligning the digital video signal further comprises interpolating pixels at an expected frequency and spacing for a detected video resolution.

4. The method of claim 1, wherein the characteristic of the analog video signal is related to at least one of a frequency characteristic of the analog video signal, synchronization information of the analog video signal, or a voltage characteristic of the analog video signal.

5. The method of claim 1, wherein converting the analog video signal further comprises sampling the analog video signal using one of at least two sampling frequencies, the one of the at least two sampling frequencies being selected as a function of the characteristic of the analog video signal.

6. The method of claim 1, wherein converting the analog video signal further comprises:
   sampling the analog video signal at a predetermined fixed frequency in a first mode of operation; and
   sampling the analog video signal at a variable frequency according to a frequency characteristic of the analog video signal in a second mode of operation.

7. The method of claim 6, wherein the frequency characteristic includes a horizontal synchronization component of the analog video signal.

8. A circuit for converting analog video signals to digital video signals, the circuit comprising:
   an analog to digital converter configured to convert an analog video signal to a digital video signal at a sampling frequency determined as a function of at least one characteristic of the analog video signal;
   a first low pass filter coupled to the analog to digital converter and configured to selectively filter the digital video signal;

a first decimator coupled to the first low pass filter and configured to selectively decimate the digital video signal;

a second low pass filter coupled to the first decimator and configured to selectively further filter the digital video signal as a function of at least one characteristic of the digital video signal;

a second decimator coupled to the second low pass filter and configured to selectively further decimate the digital video as a function of the at least one characteristic of the digital video signal; and an aligner coupled to the second decimator and configured to align the digital video signal according to a predefined output frequency as a function of the at least one characteristic of the digital video signal.

9. The circuit of claim 8, wherein the aligner is further configured to interpolate pixels at an expected frequency and spacing for a detected video resolution.

10. The circuit of claim 8, wherein the at least one characteristic of the analog video signal is related to at least one of a frequency characteristic of the analog video signal, synchronization information of the analog video signal, or a voltage characteristic of the analog video signal.

11. The circuit of claim 10, wherein the analog to digital converter is configured to sample the analog video signal using one of at least two sampling frequencies selected as a function of the frequency characteristic of the analog video signal.

12. The circuit of claim 11, wherein the analog to digital converter is configured to:

in a first mode of operation, sample the analog video signal at a predetermined fixed frequency; and in a second mode of operation, sample the analog video signal at a variable frequency according to the frequency characteristic of the analog video signal.

13. The circuit of claim 12, wherein the frequency characteristic of the analog video signal is related to a horizontal synchronization component of the analog video signal.

14. A system for converting analog video signals to digital video signals, the system comprising:

an analog to digital converter configured to receive an analog video signal and convert the analog video signal to a digital video signal at a sampling frequency;

at least one automatic gain control component coupled to the analog to digital converter and configured to adjust a gain of the digital video signal;

a low pass filter block coupled to the at least one automatic gain control component and configured to selectively filter the digital video signal as a function of a video resolution of the digital video signal;

a decimator coupled to the low pass filter block and configured to selectively decimate the digital video signal as a function of the video resolution of the digital video signal; and an aligner configured to selectively align the digital video signal according to a predefined output frequency.

15. The system of claim 14, wherein the aligner is further configured to interpolate pixels at an expected frequency and spacing for a detected video resolution.

16. The system of claim 14, wherein the at least one automatic gain control component is further configured to adjust a dynamic range of the digital video signal to reduce noise and clipping.

17. The system of claim 14, further comprising at least one second automatic gain control component coupled to the decimator and configured to adjust brightness and contrast of the digital video signal.

18. The system of claim 14, wherein the at least one characteristic is related to least one of a frequency characteristic of the analog video signal, synchronization information of the analog video signal, or a voltage characteristic of the analog video signal.

19. The system of claim 18, wherein the frequency characteristic is related to a horizontal synchronization component of the analog video signal.

20. The system of claim 14, further comprising a second low pass filter and a second decimator coupled to the low pass filter and the decimator and configured to further filter and decimate the digital video signal as a function of the video resolution of the digital video signal.

* * * * *